United States Patent
Panteleev et al.

(10) Patent No.: US 8,621,329 B2
(45) Date of Patent: Dec. 31, 2013

(54) RECONFIGURABLE BCH DECODER

(75) Inventors: Pavel A. Panteleev, Moscow (RU); Elyar E. Gasanov, Moscow (RU); Ilya V. Neznanov, Moscow (RU); Andrey P. Sokolov, Moscow (RU); Yurii S. Shutkin, Moscow (RU)

(73) Assignee: LSI Corporation, San Jose, CA (US)

( * ) Notice: Subject to any disclaimer, the term of this patent is extended or adjusted under 35 U.S.C. 154(b) by 407 days.

(21) Appl. No.: 13/044,809

(22) Filed: Mar. 10, 2011

(65) Prior Publication Data

US 2012/0054586 A1    Mar. 1, 2012

(30) Foreign Application Priority Data

Aug. 30, 2010 (RU) ................................ 2010135817

(51) Int. Cl.
*H03M 13/00* (2006.01)

(52) U.S. Cl.
USPC ............................ 714/774; 714/785; 714/781

(58) Field of Classification Search
USPC .................................. 714/774, 785, 781, 782
See application file for complete search history.

(56) References Cited

U.S. PATENT DOCUMENTS

| | | | | |
|---|---|---|---|---|
| 4,525,838 A | * | 6/1985 | Patel | 714/755 |
| 4,675,869 A | * | 6/1987 | Driessen | 714/759 |
| 5,051,999 A | * | 9/1991 | Erhart et al. | 714/774 |
| 5,430,739 A | * | 7/1995 | Wei et al. | 714/784 |
| 5,440,570 A | * | 8/1995 | Wei et al. | 714/782 |
| 5,936,978 A | * | 8/1999 | Ramesh et al. | 714/762 |
| 7,761,779 B2 | * | 7/2010 | Kanai et al. | 714/805 |
| 7,945,842 B2 | * | 5/2011 | He et al. | 714/779 |
| 2008/0155381 A1 | | 6/2008 | Gasanov et al. | 714/782 |
| 2010/0031126 A1 | | 2/2010 | Andreev et al. | 714/782 |
| 2010/0042907 A1 | | 2/2010 | Pilsl | 714/782 |

* cited by examiner

*Primary Examiner* — Joseph D Torres
(74) *Attorney, Agent, or Firm* — Christopher P. Maiorana, PC

(57) ABSTRACT

An apparatus generally having a port, a first circuit and a second circuit is disclosed. The port may be configured to receive a current length of a codeword. The current length may be less than a maximum length of the codeword that the apparatus is designed to decode. The first circuit may be configured to calculate in parallel (i) a sequence of intermediate syndromes from the codeword and (ii) a sequence of correction values based on the current length. The second circuit may be configured to generate a particular number of updated syndromes by modifying the intermediate syndromes with the correction values. The particular number is generally twice a maximum error limit of the codeword.

20 Claims, 4 Drawing Sheets

RECONFIGURABLE BCH DECODER

This application claims the benefit of Russian Application No. 2010135817, filed Aug. 30, 2010 and is hereby incorporated by reference in its entirety.

FIELD OF THE INVENTION

The present invention relates to BCH codes generally and, more particularly, to a method and/or apparatus for implementing a reconfigurable BCH decoder.

BACKGROUND OF THE INVENTION

Binary BCH codes are a powerful class of multiple error-correcting codes. BCH codes have a wide range of applications, such as optical communications, wireless communications and magnetic recording systems. When applying systematic BCH encoding, data is transmitted in codewords. The codewords include the original data bits and a number of parity bits. Every binary BCH code within an extension field $GF(2^d)$ is defined by a codeword length (i.e., n) and a maximum error limit (i.e., t). Each BCH codeword uses parity symbols to correct the received message. Up to t errors created during transmission can be corrected.

Most hardware implementations of BCH encoders/decoders deal with a fixed maximum error limit and a fixed code length. The maximum error limit parameter and the code length parameter are fixed at instantiation time of the encoder module and the decoder module and cannot be changed at runtime. However, controllers in modern storage systems for Multi-Level Cell (MLC) FLASH memory and other systems are specified to support many different maximum error limits and codeword lengths in a single design.

Referring to FIG. 1, a block diagram of a conventional BCH decoder 20 is shown. The decoder 20 includes a circuit 22 for Syndrome Calculations (SC), a circuit 24 for Key Equation Solving (KES), a circuit 26 for Error Correction (EC) and a First-In-First-Out (FIFO) buffer 28. In operation, the circuit 22 accepts a received codeword symbol-by-symbol and provides a set of syndromes to the circuit 24. The circuit 24 implements a key equation solving technique, such as the Berlekamp-Massey technique, the Euclidian technique or the Peterson technique. The circuit 24 calculates an error-locator polynomial based on the syndromes. The error-locator polynomial provides the positions of errors in the codewords. The circuit 24 passes the error-locator polynomial to the circuit 26. The circuit 26 uses the error-locator polynomial to perform data corrections. A binary failure signal (i.e., FAIL) of the circuit 26 is asserted if a number of corrected data symbols is more than the maximum error limit.

SUMMARY OF THE INVENTION

The present invention concerns an apparatus generally having a port, a first circuit and a second circuit. The port may be configured to receive a current length of a codeword. The current length may be less than a maximum length of the codeword that the apparatus is designed to decode. The first circuit may be configured to calculate in parallel (i) a sequence of intermediate syndromes from the codeword and (ii) a sequence of correction values based on the current length. The second circuit may be configured to generate a particular number of updated syndromes by modifying the intermediate syndromes with the correction values. The particular number is generally twice a maximum error limit of the codeword.

The objects, features and advantages of the present invention include providing a method and/or apparatus for implementing a reconfigurable BCH decoder that may (i) provide rapid reconfiguration, (ii) be reconfigurable at runtime, (iii) use a small silicon area, (iv) operate with different codeword lengths and/or (v) operate with different correctable error limits for the codewords.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Changing BCH (Bose, Ray-Chaudhuri, Hocquenghem) code parameters at runtime may be a criteria of in Solid-State Disk (SSD) FLASH controllers. The parameters may include the maximum error limit t and the codeword length n. Some embodiments of the present invention generally permit the maximum error limit t and/or the codeword length n to be changed at runtime through one or more configuration signals. To achieve a fast power up speed, the reconfiguration time is generally short (e.g., less than 3 cycles).

Figure 1:
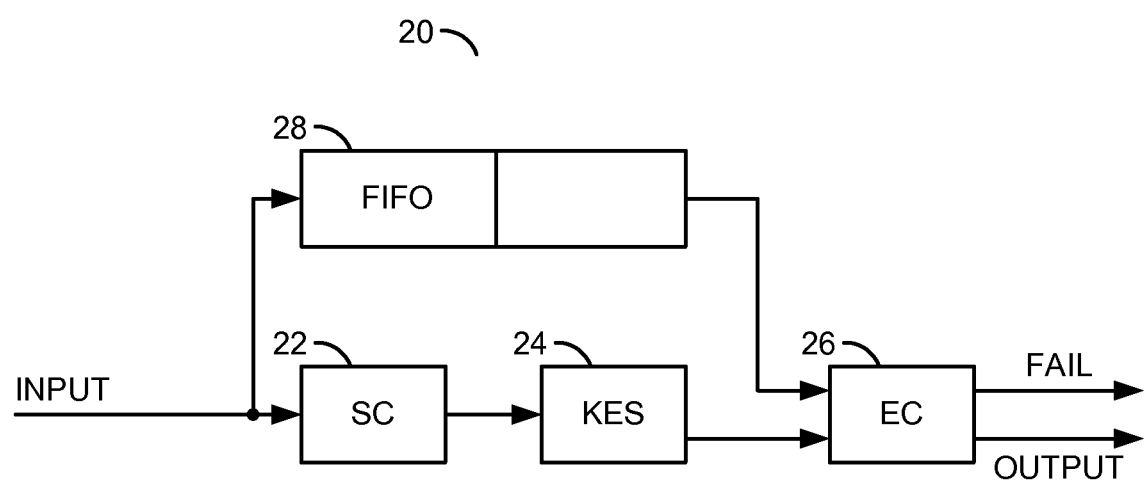
FIG. 1 is a block diagram of a conventional BCH decoder.
Figure 2:
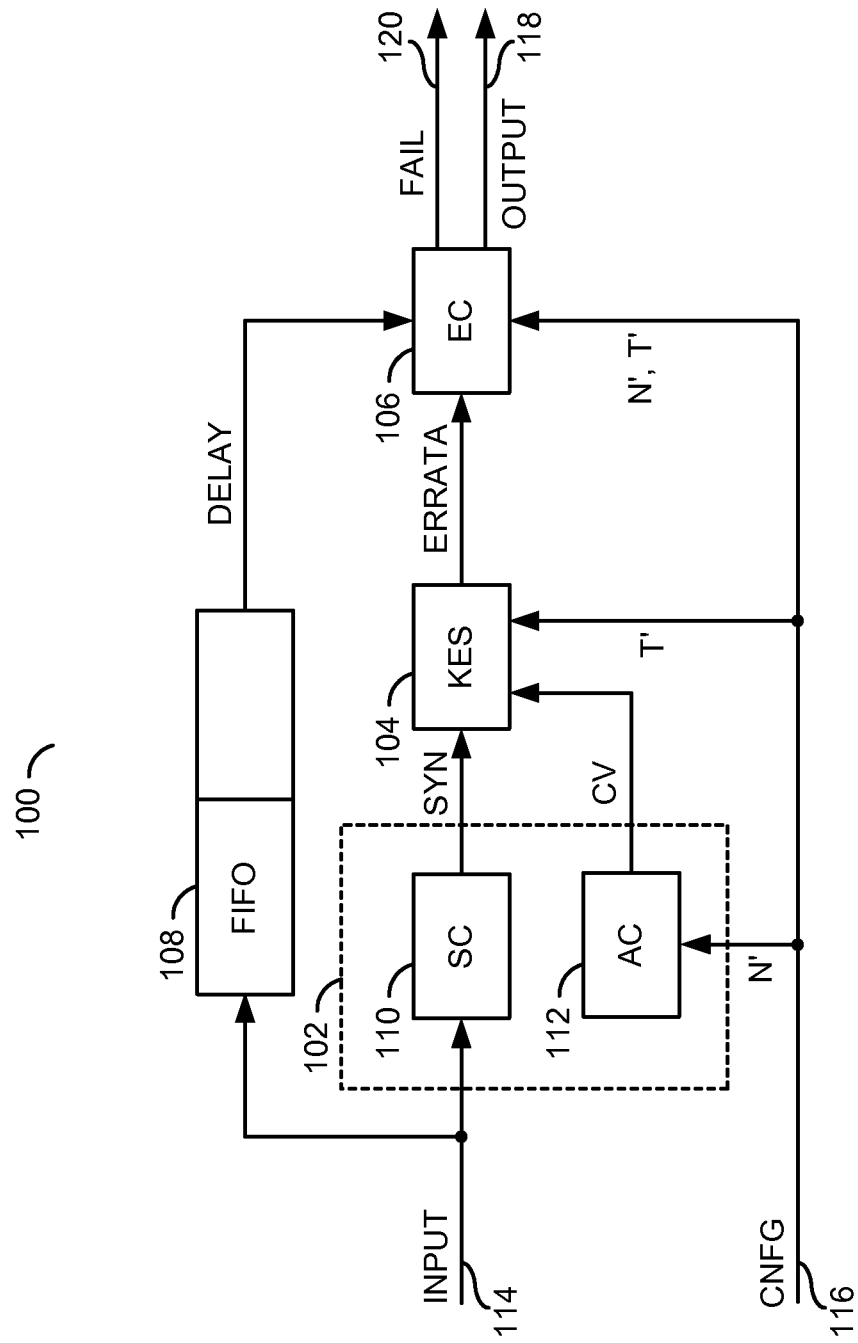
FIG. 2 is a block diagram of an example implementation of an apparatus in accordance with a preferred embodiment of the present invention.

Referring to FIG. 2, a block diagram of an example implementation of an apparatus 100 is shown in accordance with a preferred embodiment of the present invention. The apparatus (or device) 100 may be configured as a BCH decoder apparatus. The apparatus 100 generally comprises a circuit (or module) 102, a circuit (or module) 104, a circuit (or module) 106 and a circuit (or module) 108. The circuit 102 may comprise a circuit (or module) 110 and a circuit (or module) 112. The apparatus 100 generally includes a port (or interface) 114, a port (or interface) 116, a port (or interface) 118 and a port (or interface) 120. The circuits 102 to 112 may represent modules and/or blocks that may be implemented as hardware, software, a combination of hardware and software, or other implementations.

The circuit 108 and the circuit 110 may receive a signal (e.g., INPUT) through the port 114. A signal (e.g., DELAY) may be presented from the circuit 108 to the circuit 106. The circuit 106 may generate and present a signal (e.g., FAIL) at the port 120. A signal (e.g., OUTPUT) may also be generated and presented by the circuit 106 at the port 118. A signal (e.g., SYN) may be generated by the circuit 110 and presented to the circuit 104. The circuit 104 may generate a signal (e.g., ERRATA) that is received by the circuit 106. A signal (e.g., CNFG) may be received at the port 116 and transferred to the circuits 104, 106 and 112. The signal CNFG generally comprises a signal (e.g., N') received by the circuits 106 and 112. The signal CNFG may also comprise a signal (e.g., T') that is received by the circuits 104 and 106. The circuit 112 may generate a signal (e.g., CV) which is received by the circuit 104. In some embodiments, the port 116 may comprise multiple (e.g., 2) ports, a single port for each component of the signal CNFG.

The circuit 102 may implement a calculator circuit. The circuit 102 is generally operation to generate in parallel both (i) a sequence of intermediate syndromes from a codeword and (ii) a sequence of correction values based on a current length (e.g., n') of the codeword. Codewords may be received via the signal INPUT. The current length n' of the codewords may be received via the signal N'. Intermediate syndromes may be presented in the signal SYN. Correction values may be presented in the signal CV. The current length n' generally establishes a length of each codeword received in the signal INPUT. In some configurations of the apparatus 100, the current length n' may be less than the maximum codeword length n that the apparatus 100 is designed to decode. In other configurations, the current length n' may match the maximum codeword length n.

The circuit 104 may be implemented as a key equation solver circuit. The circuit 104 may be operational to calculate an error-locator polynomial based on (i) the syndromes from the signal SYN, (ii) the correction values from the signal CV and (iii) a current error limit (e.g., t') from the signal T'. In some embodiments, the circuit 104 may implement the Berlekamp-Massey technique, the Euclidian technique or the Peterson technique. Other error-locator polynomial generating techniques may be implemented to meet the criteria of a particular application. Each error-locator polynomial generally provides the positions and magnitudes of errors in a corresponding codeword. The error-locator polynomials may be presented in the signal ERRATA. The current error limit t' generally establishes a current number of potential errors in each codeword that may be correctable by the apparatus 100. In some configurations, the current error limit t' may be less than the maximum error limit t that the apparatus 100 is designed to correct. In other configurations, the current error limit t' may match the maximum error limit t.

The circuit 106 may implement an error correction circuit. The circuit 106 is generally operational to calculate reconstructed codewords based on (i) the error-locator polynomials, (ii) delayed copies of the received codewords, (iii) the current length n' of the codewords and (iv) the current error limit t'. The error-locator polynomials may be received via the signal ERRATA. The delayed copies of the codewords are generally received in the signal DELAY. The current codeword length n' may be received in the signal N'. The current error limit t' may be received in the signal T'. The circuit 106 may also be operational to generate the signal FAIL based on the information provided in the signal ERRATA. The signal FAIL may be asserted by the circuit 106 if a number of errors in a codeword exceeds the current error limit t'.

The circuit 108 may implement a FIFO memory circuit. The circuit 108 may be designed to hold multiple copies (e.g., 2 copies) of the received codewords from the signal INPUT during multiple (e.g., 2) pipeline stages. After the delay, the each buffered codeword may be presented in sequence to the circuit 106 via the signal DELAY.

The circuit 110 may implement a syndrome calculator circuit. The circuit 110 is generally operational to generate multiple intermediate syndromes from each received codeword. The intermediate syndromes may be presented to the circuit 104 in the signal SYN. Where the current length n' of a codeword is less than a maximum codeword length n, the circuit 110 may pad the codewords with constants (e.g., zeros) to expand the codewords to full size. Therefore, the intermediate syndromes generated for each truncated codeword should be adjusted before the error-locator polynomials are calculated.

The circuit 112 may implement an Alpha Calculator (AC) circuit. The circuit 112 is generally operational to calculate correction values that enable the circuit 104 to modify the intermediate syndromes generated by the circuit 110. The correction values may be presented to the circuit 104 in the signal CV.

The circuit 100 may be reconfigurable at runtime by setting a configuration value (e.g., current codeword length n') in the signal N' and another configuration value (e.g., current error limit t') in the signal T'. The combination of the values in the signals N' and T' may represent reconfiguration data for the apparatus 100.

Apparatus 100 may receive a sequence of codewords in the signal INPUT. In the following example, (i) the current codeword length n' may be the maximum codeword length n and (ii) the current error limit t' may be the maximum error limit t. Each codeword generally comprises a set of symbols $(C_{n-1}, \ldots, C_0)$, where each symbol $C_i$ may be an element of a set $\{0,1\}$. Each codeword may be treated as a codeword polynomial $C(X)=C_{n-1}X^{n-1}+\ldots+C_1X+C_0$. A codeword polynomial may be used by the circuit 110 to generate syndromes as follows: $S_i=C(\alpha^i)$, $i=1, 2, \ldots, 2t$. The value t is generally the maximum number of errors that the BCH code may correct in each codeword. The element $\alpha$ may be a primitive element of an extension field $GF(2^d)$ (e.g., a Galois Field having $2^d$ elements) associated with the BCH code. In a case where the codeword length n matches $2^d-1$, the syndromes $S_1, S_2, \ldots, S_{2t}$ may be generated by the circuit 110 in final form. Circuit 104 generally uses a key equation solving technique (e.g., Berlekamp-Massey technique) to generate the error-locator polynomial (e.g., $\Lambda(x)$) from the syndromes. Circuit 106 may use the error-locator polynomial to correct error positions in the delayed codeword received from the circuit 108. The circuit 106 may also report a failure if the number of error positions is more than the correctable error limit. The failure may be reported by asserting the signal FAIL.

The above example may be modified to handle BCH codes were the current error limit t' is less than the maximal error limit t (e.g., t'<t). To account for the lower error limit, the circuit 104 may perform 2t' iterations, instead of 2t iterations, in generating the error-locator polynomial. Modifications to handle a shortened codeword length n' less than the regular codeword length n may be accomplished by using a truncated BCH code. For instance, a truncated codeword $C'=(C_{n'-1}, \ldots, C_0)$ may be padded with constants (e.g., zeros) to create a full-length codeword $C=(C_{n'-1}, \ldots, C_0, 0, \ldots, 0)$. A corresponding codeword polynomial may be expressed as $C'(X) = X^{\Delta n}C'(X)$, where $C'(X)=C_{n'-1}X^{n'-1}+\ldots+C_1X+C_0$ and $\Delta n=n-n'=2^d-1-n$. Hence, a normal scheme for computing syndromes may generate intermediate syndromes $S'_i=C'(\alpha^i)$, $i=1, 2, \ldots, 2t$ instead of the regular syndromes $S_i=C(\alpha^i)$, $i=1, 2, \ldots, 2t$. To obtain the regular syndromes $S_1, S_2, \ldots, S_{2t}$, the intermediate syndromes $S'_1, S'_2, \ldots, S'_{2t}$ may be calculated and subsequently modified by a formula $S_i=\alpha^{i\Delta n}S'_i$, $i=1, 2, \ldots, 2t$.

The value $\Delta n$ generally depends on the configuration parameter current codeword length n' and thus may be difficult to evaluate in a small number of processing cycles. Standard techniques for calculating values $\alpha^{\Delta n}, \alpha^{2\Delta n}, \ldots, \alpha^{2t\Delta n}$ may utilize $\Delta n$ processing cycles.

In some embodiments, the apparatus 100 may be configured in a constant number of processing cycles and independently of the current codeword length n'. Therefore, the apparatus 100 may be reconfigured on-the-fly in a small number of processing (reconfiguration) cycles. For example, the apparatus 100 may be configured at runtime when initially powered on. As such, the apparatus 100 may be applied in modern applications of BCH codes, such as the SSD FLASH controllers, in which the configuration parameters may be changeable at runtime. Furthermore, the circuitry of apparatus 100 may occupy a low area of the silicon.

Apparatus 100 generally achieves rapid configuration times by sequentially calculating correction values $\alpha^{\Delta n}$, $\alpha^{2\Delta n}$, ..., $\alpha^{2t\Delta n}$ substantially simultaneously (in parallel) with the sequential generation of the intermediate syndromes $S'_1, S'_2, \ldots, S'_{2t}$. As each intermediate syndrome and each corresponding correction value is generated, updated (regular) syndromes may be sequentially calculated as $S_1 = \alpha^{\Delta n} S'_1$, $S_2 = \alpha^{2\Delta n} S'_2, \ldots, S_{2t} = \alpha^{2t\Delta n} S'_{2t}$. Calculations of the correction values may be simplified because $\alpha^{\Delta n} = \alpha^{2^d-1-n'} = \alpha^{-n'}$ and $\alpha^{2^d-1} = 1$ in the field $GF(2^d)$. Therefore, a sequence of correction values may be generated by the circuit 112 using a multiplier that performs multiplication by a constant value.

Figure 3:
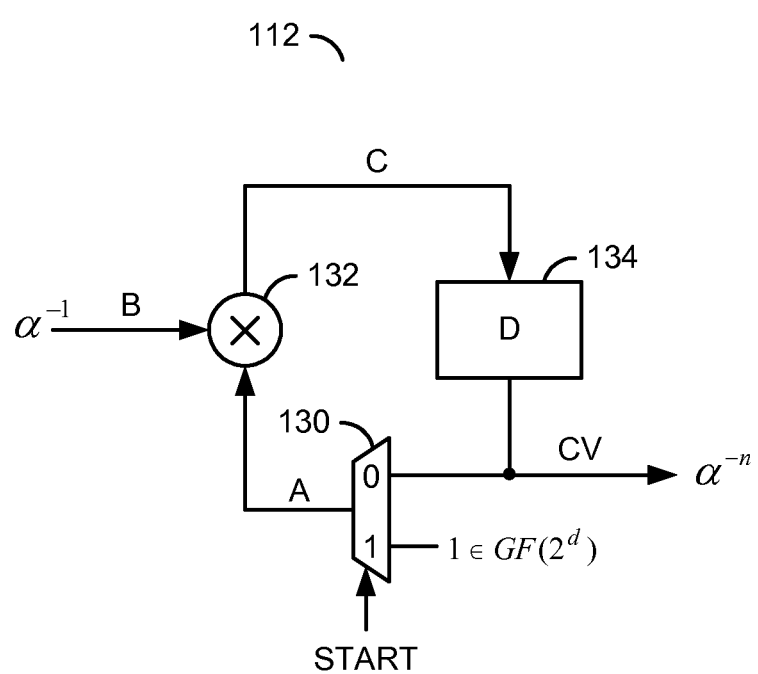
FIG. 3 is a block diagram of a partial implementation of an alpha calculation circuit of the apparatus.

Referring to FIG. 3, a block diagram of a partial implementation of the circuit 112 is shown. The circuit 112 generally comprises a circuit (or module) 130, a circuit (or module) 132 and a circuit (or module) 134. The circuits 130 to 134 may represent modules and/or blocks that may be implemented as hardware, software, a combination of hardware and software, or other implementations.

A signal (e.g., START) may be received by the circuit 130 at a selection input. The circuit 130 may generate a signal (e.g., A) received at an input of the circuit 132. A signal (e.g., B) may convey a constant value (e.g., $\alpha^{-1}$) to another input of the circuit 132. The circuit 132 may generate a signal (e.g., C) received by the circuit 134. The circuit 134 may generate the signal CV. The signal CV may be connected to an input (e.g., a "0" input) of the circuit 130. A unity value (e.g., 1) in a field $GF(2^d)$ may be received by the circuit 130 at another input (e.g., a "1" input).

The circuit 130 may be implemented as a multiplexer circuit. The circuit 130 is generally operational to multiplex the unity value and the signal CV to the signal A. Control of the multiplexing may be provided by the signal START.

The circuit 132 may implement a Galois Field multiplier circuit. The circuit 132 may be operational to multiply the value received in the signal A by the constant value $\alpha^{-1}$ from the signal B. The resulting product value may be transferred in the signal C to the circuit 134.

The circuit 134 generally implements a buffer circuit. The circuit 134 may buffer the product value received in the signal C. A new product value may be stored in the circuit 134 for each processing cycle. The buffered product value may be presented in the signal CV to the circuit 130 and the circuit 104 (FIG. 2).

When the signal START has an initialization value (e.g., "1"), the circuit 112 generally initializes the calculations of the correction values. While the signal START has an active value (e.g., "0"), the circuit 112 may generate a new correction value in each processing cycle (e.g., each clock cycle), simultaneously with the circuit 110 (FIG. 2) generating the intermediate syndromes. During an initial cycle, the unity value may be presented from the circuit 130 to the circuit 132. The circuit 132 may multiply the unity value by the constant value $\alpha^{-1}$ and present the product value (e.g., $\alpha^{-1}$) to the circuit 134 for storage. The circuit 134 generally presents the buffered product value in the signal CV as the initial correction value.

During a next cycle, the circuit 130 may route the initial correction value from the circuit 134 to the circuit 132. The circuit 132 may multiply the initial correction value by the value and present the next product value (e.g., $\alpha^{-2}$) to the circuit 134 as the next correction value. The circuit 134 may present the next correction value in the signal CV. The cycles generally repeat until a final correction value (e.g., $\alpha^{-2t}$) is generated in the 2t-th cycle.

A new correction value may be transferred to the circuit 104 in each cycle. The circuit 104 may be designed to utilize the syndrome values sequentially. For example, during the initial cycle, the circuit 104 may iterate using only the intermediate syndrome $S_1$. During a next cycle, the circuit 104 may iterate using two syndromes $S_1, S_2$. Iterations may continue in the circuit 104 until all of the syndromes have been utilized. Hence, sufficient time may exist during the operation of the circuits 104, 110 and 112 to calculate all appropriate values using only two non-constant multipliers.

Figure 4:
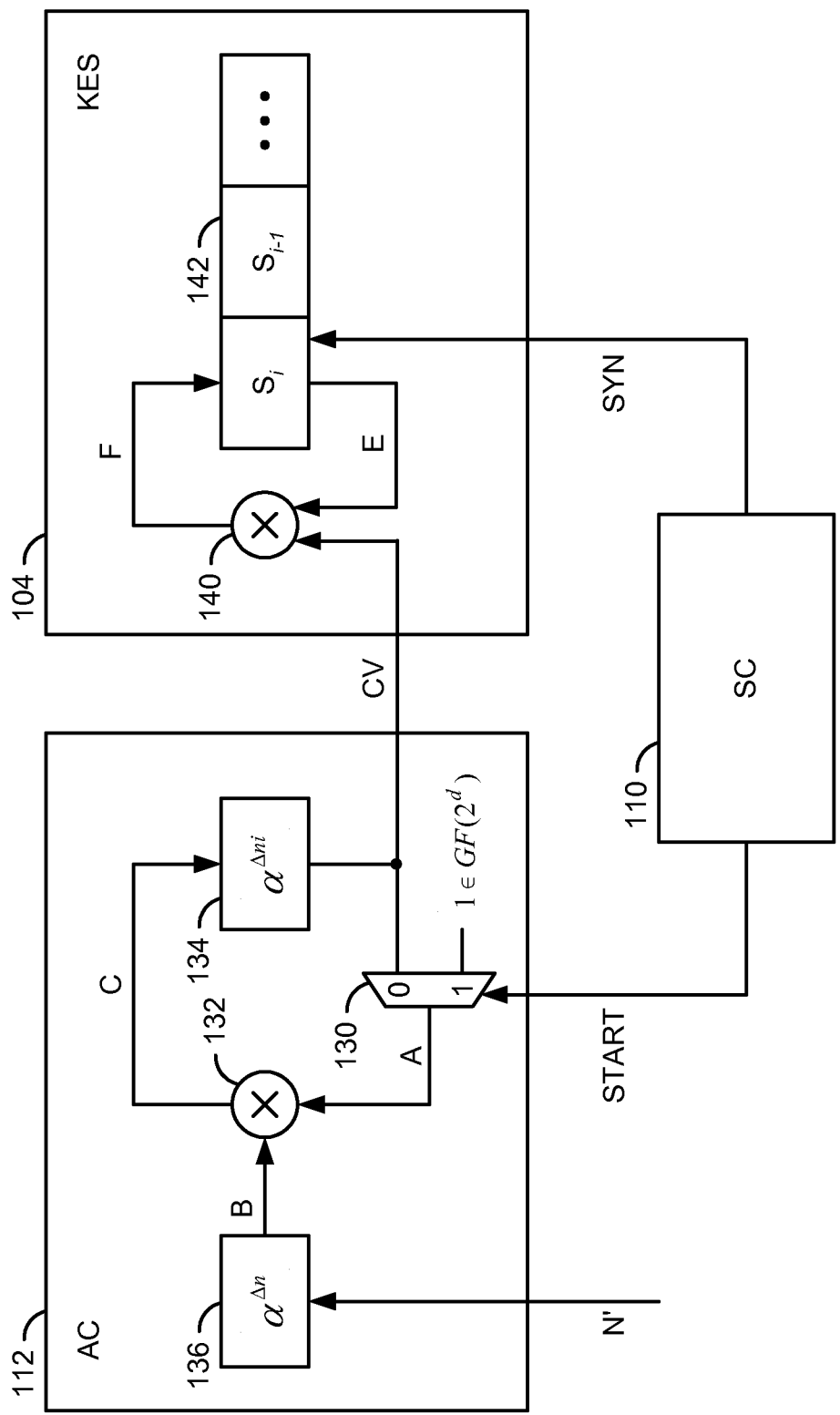
FIG. 4 is a detailed block diagram of a portion of the apparatus.

Referring to FIG. 4, a detailed block diagram of a portion of the apparatus 100 is shown. The circuit 112 may comprise the circuit 130, the circuit 132, the circuit 134 and a circuit (or module) 136. The circuit 104 may comprise a circuit (or module) 140 and a circuit (or module) 142. The circuits 130 to 142 may represent modules and/or blocks that may be implemented as hardware, software, a combination of hardware and software, or other implementations.

The circuit 136 may generate the signal B. The signal CV may be generated by the circuit 134 and transferred to an input of the circuit 130 and the circuit 140. A signal (e.g., E) may be generated by the circuit 142 and received by another input of the circuit 140. The circuit 140 may generate a signal (e.g., F) that is received by the circuit 142. The signal SYN may transferred from the circuit 110 to the circuit 142. The signal START may be generated by the circuit 110 and received by the circuit 130. The signal N' may be received by the circuit 136.

The circuit 136 may implement a read-only memory circuit. The circuit 136 may be programmed with multiple constant values, a different constant value for each possible current length n'. Selection among constant values may be determined by the signal N'. The selected constant value may be presented in the signal B.

The circuit 140 may implement a Galois Field multiplier circuit. The circuit 140 may be operational to multiply a correction value receive in the signal CV by an intermediate syndrome received in the signal E. The resulting product may be an updated syndrome. The updated syndrome may be transferred to the circuit 142 via the signal F.

The circuit 142 may implement a multi-word register. The circuit 142 may be operational to buffer the intermediate syndromes as received in the signal SYN. The circuit 142 may also overwrite the intermediate syndromes with the updated syndromes as received in the signal F. The contents of the circuit 142 are generally available to other circuitry within the circuit 104 to calculate the error-locator polynomial.

The circuit 110 may transition the signal START from the initialization value to the active value at the beginning of the initial cycle in which the intermediate syndrome $S'_1$ and the correction value $\alpha^{\Delta n}$ are calculated. By an end of the initial cycle, the intermediate syndrome $S'_1$ may be transferred via the signal SYN to the circuit 142 for storage. The initial correction value $\alpha^{\Delta n}$ may be stored in the circuit 134 by the end of the cycle.

At the start of a next cycle, the circuit 142 may present the intermediate syndrome $S'_1$ to the circuit 140. The circuit 134 may present the correction value $\alpha^{\Delta n}$ to the circuit 140. The circuit 140 may multiply the intermediate syndrome $S'_1$ by the correction value $\alpha^{\Delta n}$ to generate an updated syndrome $S_1$. The updated syndrome $S_1$ may be transferred back to the circuit 142 where the updated syndrome $S_1$ replaces the intermediate syndrome $S'_1$. During the cycle, the circuit 110 may generate the intermediate syndrome $S'_2$ and the circuit 112 may generate the correction value $\alpha^{2\Delta n}$. By the end of the cycle, the intermediate syndrome $S'_2$ may be stored in the circuit 142 and the correction value $\alpha^{2\Delta n}$ may be stored in the circuit 134. The cycles may be repeated until all of the updated syndromes $S_1, S_2, \ldots, S_{2t}$ are buffered in the circuit 142. In some embodiments, the circuit 104 may wait until the signal START returns to the initialization value (e.g., circuits 110 and 112 are finished) before generating the error-locator polynomial. In other embodiments, the circuit 104 may begin calculating the error-locator polynomial as soon as the updated syndrome $S_1$ is available.

The functions performed by the diagrams of FIGS. 2-4 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products) or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (electronically programmable ROMs), EEPROMs (electronically erasable ROMs), UVPROM (ultra-violet erasable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, storage and/or playback devices, video recording, storage and/or playback devices, game platforms, peripherals and/or multi-chip modules. Those skilled in the relevant art(s) would understand that the elements of the invention may be implemented in other types of devices to meet the criteria of a particular application. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a port configured to receive a current length of a codeword, wherein said current length is less than a maximum length of said codeword that said apparatus is designed to decode;
a first circuit configured to calculate in parallel (i) a sequence of intermediate syndromes from said codeword, one of said intermediate syndromes at a time, and (ii) a sequence of correction values based on said current length, one of said correction values at a time; and
a second circuit configured to generate a particular number of updated syndromes by modifying said intermediate syndromes with said correction values, wherein said particular number is twice a maximum error limit of said codeword.

2. The apparatus according to claim 1, wherein said apparatus performs a BCH decoding.

3. The apparatus according to claim 1, wherein said first circuit is further configured to (i) generate a first of said correction values by multiplying a constant value by a unity value in a Galois Field and (ii) store said first correction value in a buffer.

4. The apparatus according to claim 3, wherein said first circuit is further configured to generate a second of said correction values by multiplying said constant value by said first correction value as read from said buffer.

5. The apparatus according to claim 1, wherein said second circuit comprises a multiplier circuit configured to generate said updated syndromes by multiplying each of said intermediate syndromes with a different one of said correction values.

6. The apparatus according to claim 5, wherein said multiplying is performed sequentially to generate one of said updated syndromes at a time.

7. The apparatus according to claim 1, wherein (i) said port is further configured to receive a current error limit of said codeword and (ii) said current error limit is less than said maximum error limit of said codeword that said apparatus is designed to correct.

8. The apparatus according to claim 7, wherein (i) said second circuit is further configured to iterate at most a given number of times to locate one or more errors in said codeword and (ii) said given number is twice said current error limit.

9. The apparatus according to claim 1, wherein reconfiguration of said apparatus is (i) performed in a constant number of clock cycles and (ii) independent of said current length.

10. The apparatus according to claim 1, wherein said first circuit comprises (i) a syndrome calculator configured to generate said intermediate syndromes and (ii) a third circuit configured to generate said correction values.

11. A method for reconfiguration of a decoder, comprising the steps of:
(A) receiving a current length of a codeword, wherein said current length is less than a maximum length of said codeword that said decoder is designed to decode;
(B) calculating in parallel using said decoder (i) a sequence of intermediate syndromes from said codeword, one of said intermediate syndromes at a time, and (ii) a sequence of correction values based on said current length, one of said correction values at a time; and
(C) generating a particular number of updated syndromes by modifying said intermediate syndromes with said correction values, wherein said particular number is twice a maximum error limit of said codeword.

12. The method according to claim 11, wherein the steps perform a BCH decoding.

13. The method according to claim 11, further comprising the steps of:
generating a first of said correction values by multiplying a constant value by a unity value in a Galois Field; and
storing said first correction value in a buffer.

14. The method according to claim 13, further comprising the step of:
generating a second of said correction values by multiplying said constant value by said first correction value as read from said buffer.

15. The method according to claim 11, wherein said generating of said updated syndromes multiplies each of said intermediate syndromes with a different one of said correction values.

16. The method according to claim 15, wherein said multiplying is performed sequentially to generate one of said updated syndromes at a time.

17. The method according to claim 11, further comprising the step of:
receiving a current error limit of said codeword, wherein current error limit is less than said maximum error limit of said codeword that said decoder is designed to correct.

18. The method according to claim 17, further comprising the step of:
iterating at most a given number of times to locate one or more errors in said codeword, wherein said given number is twice said current error limit.

19. The method according to claim 11, further comprising the step of:
reconfiguring said decoder (i) in a constant number of clock cycles and (ii) independent of said current length.

20. An apparatus comprising:
means for receiving a current length of a codeword, wherein said current length is less than a maximum length of said codeword that said apparatus is designed to decode;
means for calculating in parallel (i) a sequence of intermediate syndromes from said codeword, one of said intermediate syndromes at a time, and (ii) a sequence of correction values based on said current length, one of said correction values at a time; and
means for generating a particular number of updated syndromes by modifying said intermediate syndromes with said correction values, wherein said particular number is twice a maximum error limit of said codeword.

* * * * *